US 6,524,892 B1

(12) United States Patent
Kishimoto et al.

(10) Patent No.: US 6,524,892 B1
(45) Date of Patent: Feb. 25, 2003

(54) METHOD OF FABRICATING MULTILAYER FLEXIBLE WIRING BOARDS

(75) Inventors: Soichiro Kishimoto, Kanuma (JP); Hiroyuki Hishinuma, Kanuma (JP)

(73) Assignee: Sony Chemicals Corp., Tokyo (JP)

( * ) Notice: Subject to any disclaimer, the term of this patent is extended or adjusted under 35 U.S.C. 154(b) by 0 days.

(21) Appl. No.: 09/707,957

(22) Filed: Nov. 8, 2000

(30) Foreign Application Priority Data

Nov. 10, 1999 (JP) ............................................ 11-320298

(51) Int. Cl.[7] .......................... H01L 21/44; H01L 21/48; H01L 21/50
(52) U.S. Cl. ....................... 438/120; 438/118; 438/107; 438/612; 438/613; 438/614; 438/617; 438/618
(58) Field of Search ................................. 438/119, 120, 438/118, 107, 612–617, 108, 618

(56) References Cited

U.S. PATENT DOCUMENTS

| | | | |
|---|---|---|---|
| 5,223,321 A | * | 6/1993 | Sinnadurai et al. .......... 428/138 |
| 5,296,649 A | * | 3/1994 | Kosuga et al. ............... 174/250 |
| 5,884,835 A | * | 3/1999 | Kajiwara et al. ......... 228/110.1 |
| 6,041,495 A | * | 3/2000 | Yoon et al. .................... 29/841 |
| 6,103,551 A | * | 8/2000 | Ono et al. ................... 438/108 |

FOREIGN PATENT DOCUMENTS

| | | | |
|---|---|---|---|
| JP | 62-40863 U | | 3/1987 |
| JP | 62-128132 | * | 6/1987 |
| JP | 63-304648 | * | 12/1988 |
| JP | 4-37092 | | 2/1992 |

* cited by examiner

*Primary Examiner*—Carl Whitehead, Jr.
*Assistant Examiner*—Khanh B. Duong
(74) *Attorney, Agent, or Firm*—Oliff & Berridge, PLC

(57) ABSTRACT

A multilayer flexible wiring board, suited for mounting semiconductor elements. The flexible wiring board is fabricated in the following manner. A flexible wiring board piece having a metal wiring, in which a metal coating is exposed on at least a part of surface of the metal wiring, is adhered to another flexible wiring board piece having a metal projection on which a metal coating is formed. One of or both of the metal coatings on the metal wiring and the metal projection is composed of a soft metal coating a surface of which has a Vickers' hardness of 80 kgf/mm$^2$ or lower. The metal coating of the metal wiring contacts with the metal coating of said metal projection and ultrasonic wave is applied thereto to connect the metal wiring with the metal projection.

4 Claims, 8 Drawing Sheets

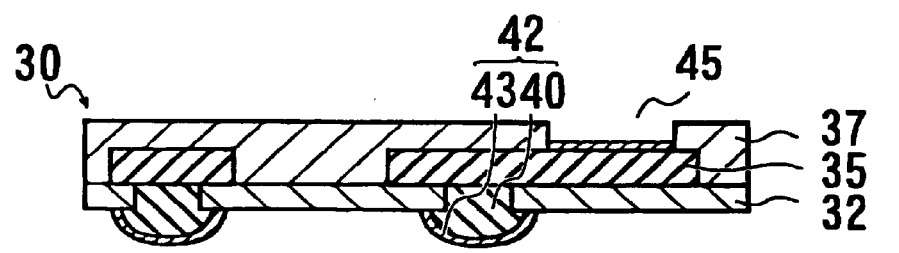
Fig. 3a
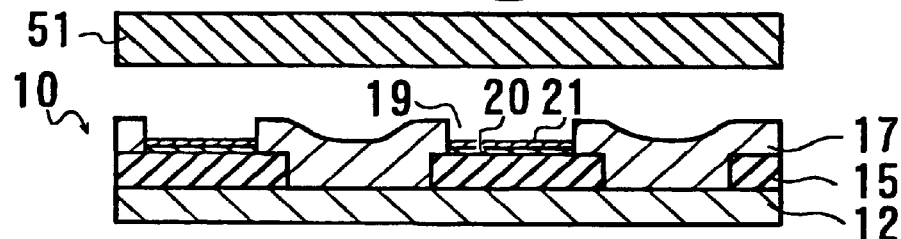
Fig. 3b
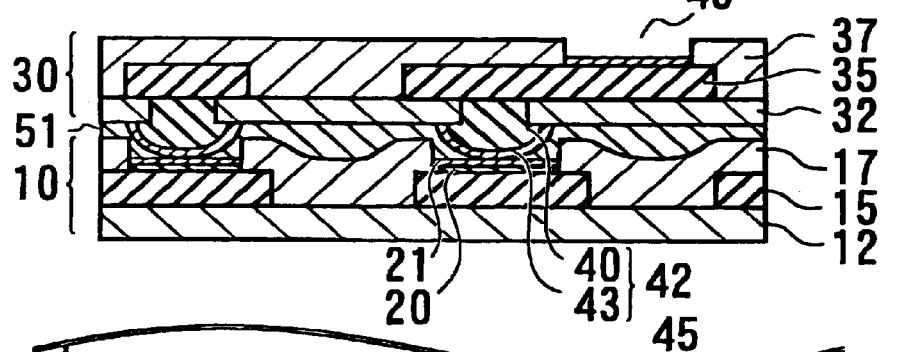
Fig. 3c
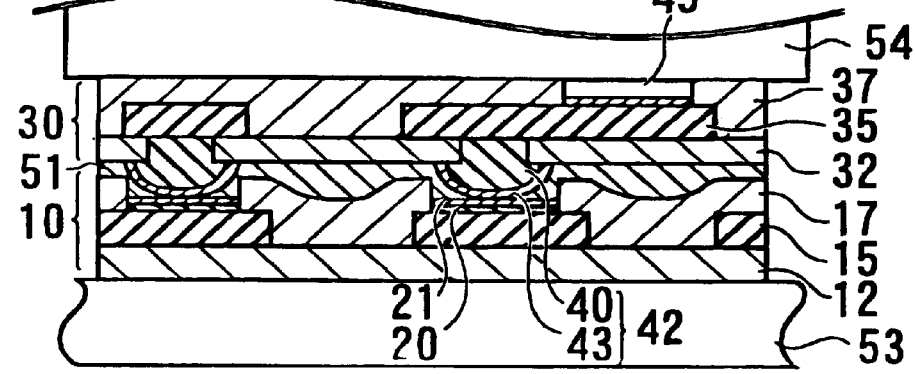
Fig. 3d
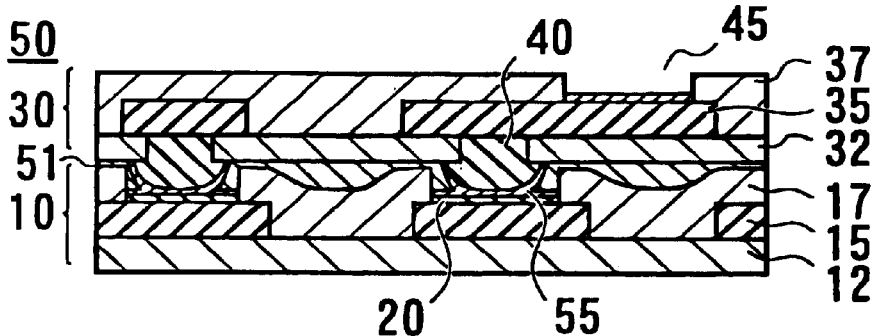

METHOD OF FABRICATING MULTILAYER FLEXIBLE WIRING BOARDS

BACKGROUND OF THE INVENTION

1. Field of the Invention

The present invention relates to a technical field of a multilayer flexible wiring board, and particularly to a multilayer flexible wiring board suited for mounting semiconductor elements.

2. Detailed Description of the Related Art

Recently, there is a demand to decrease semiconductor devices in size and a multilayer flexible wiring board which enables to mount bare chip semiconductor elements is regarded as important.

Now, referring to FIG. 8(a), reference numerals 110, 130 denote two kinds of flexible wiring board piece having a single layer structure. Fabricating steps of a multilayer flexible wiring board according to a conventional art will be explained by use of these flexible wiring board pieces 110, 130.

Out of the two kinds of flexible wiring board pieces 110, 130, one flexible wiring board piece 110 comprises a base film 112, a metal wiring 115 arranged on the base film 112, and a cover film 117 adhered on the metal wiring 115.

The metal wiring 115 and cover film 117 are patterned in predetermined shapes, respectively. Thereby the cover film 117 has a plurality of openings 119 formed therein. Each of the openings 119 is positioned above the metal wiring 115.

The other flexible wiring board piece 130 comprises a base film 137, a metal wiring 135 arranged on the base film 137, and a cover film 132 adhered on the metal wiring 135.

The base film 137, cover film 132 and metal wiring 135 are patterned in predetermined shapes, respectively. Thereby the cover film 132 and base film 137 have a plurality of openings 138, 139 formed therein, respectively.

Each of the openings 138, 139 is positioned above the metal wiring 135. At the bottom of the opening 139 provided in the base film 137, the surface of the metal wiring 135 is exposed. On the other hand, in the opening 138 provided in the cover film 132, copper is filled by metal plating method. The copper is deposited to protrude from the cover film 132 surface and a solder coating 140 is formed at the tip thereof by metal plating method. As a result, a metal projection 142 is composed of a projection body 136 and the solder coating 140.

To fabricate a multilayer flexible wiring board by adhering the above-mentioned flexible wiring board pieces 110, 130 to each other, first, as shown in FIG. 8(a), two flexible wiring board pieces 110, 130 are positioned to face the cover films 117, 132 thereof and a thermoplastic resin film 151 is interposed therebetween to close in contact with each other.

Upon heating, the thermoplastic resin film 151 is softened so as that an adhesive force thereof appears. Accordingly, when the flexible wiring board pieces 130, 110 are pressed and heated to soften the thermoplastic resin film 151, the cover films 117, 132 are adhered to each other. At the same time, the metal projection 142 is forced in the softened thermoplastic resin film 151, thereby the tip of metal projection 142 comes in contact on the metal wiring 115 (refer to FIG. 8(b)).

In this state, a soldering metal composing the solder coating 140 is melted when the temperature of the flexible wiring board pieces 110, 130 further increases. After cooling, the projection body 136 and the metal wiring 115 are connected with each other by the solidified solder metal 155 to obtain a multilayer flexible wiring board 150 (refer to FIG. 8(c)).

When an electric part such as a semiconductor chip is connected with the flexible wiring board 150, first they are appropriately positioned to each other. Next, as shown in FIG. 9(a), a bump 175 formed on an element body 171 of an electric part 170 is positioned above the metal wiring 135 exposed at the bottom of the opening 139 in the base film 137, and the tip of the bump 175 is allowed to come in contact onto the surface of the metal wiring 135.

The bump 175 is composed of a projection body 172 including copper and a solder coating 173 formed thereon. When the electric part 170 is heated while the tip of the bump 175 is contacted with the metal wiring 135, the solder coating 173 is melted to connect the projection body 172 with the metal wiring 135.

Thus, the electric part 170 is connected with multilayer flexible wiring board 150 via solder coating 173.

In the above-mentioned flexible wiring board 150, however, the solder metal 155 within the flexible wiring board 150 is also heated when the solder coating 173 of the semiconductor chip 170 is melted.

In this case, connections deteriorate when the solder metal 155 becomes brittle or the solder metal 155 is re-melted. Reference numeral 156 in FIG. 9(b) denotes a connecting portion between the metal wirings 115, 135 within the flexible wiring board 150. It shows that the solder metal 155 is re-melted and the connection between the metal wirings 115, 135 worsens.

SUMMARY OF THE INVENTION

An object of the present invention is to provide a multilayer flexible wiring board in which the above-mentioned inconvenience does not occur and also to provide a fabricating method thereof.

In order to solve the above-mentioned problems, the present invention provides a fabricating method of a multilayer flexible wiring board, said method comprising the step of laminating a flexible wiring board piece having a metal wiring, in which a metal coating is exposed on at least a part of surface of said metal wiring, to another flexible wiring board piece having metal projections on the surface of which metal coating is formed, wherein one of or both of the surface of said metal coating formed on said metal wiring and on the surface of said metal projections is composed of a soft metal coating having a Vickers' hardness of 80 kgf/mm$^2$ or lower, and wherein the method further comprises the step of applying ultrasonic wave thereto in a state where said metal coating formed on said metal wiring contacts with the metal coating formed on the surface of said metal projections to connect said metal wiring with said metal projections.

Furthermore, the present invention provides a fabricating method of a multilayer flexible wiring board, said method comprising the step of adhering a flexible wiring board piece having a metal wiring, in which metal coating is exposed on at least a part of surface of said metal wiring, to another flexible wiring board piece having metal projections on the surface which metal coating is formed, wherein one of the metal coating formed on said metal wiring and the metal coating formed on the surface of said metal projections is composed of soft metal coating having a Vickers' hardness of 80 kgf/mm$^2$ or lower, the other one of the metal coating formed on said metal wiring and the metal coating formed on the surface of the metal projections is composed of hard metal coating having a Vickers' hardness of 120 kgf/mm² or higher and soft metal coating having a Vickers' hardness of 80 kgf/mm² or lower laminated on the said hard metal coating, and wherein the method further comprises the step of applying ultrasonic wave thereto in a state where the soft metal coating formed on said metal wiring contacts with the soft metal coating formed on said metal projections to connect said metal wiring with the metal projections.

Still further, the present invention provides the fabricating method of a multilayer flexible wiring board of the foregoing, wherein a thermoplastic film is interposed between said flexible wiring board pieces, adhering said flexible wiring board pieces to each other by said thermoplastic film in advance before applying ultrasonic wave thereto, and pressing at least one of said flexible wiring board pieces to contact the metal coatings with each other while applying ultrasonic wave.

Moreover, the present invention provides the fabricating method of a multilayer flexible wiring board in the foregoing, wherein at least one of said flexible wiring board pieces is heated to 50° C. or higher when applying ultrasonic wave thereto.

The present invention also provides a multilayer flexible wiring board in which at least two layers of metal wirings are laminated while interposing at least an insulating layer therebetween, a metal projections provided on one of said metal wirings are connected with the other metal wiring by the application of ultrasonic wave, wherein soft metal coating having a Vickers' hardness of 80 kgf/mm² or lower is formed on at least one of surfaces of said metal projections and said metal wiring to be connected with said metal projections.

In the foregoing, the present invention further provides the flexible wiring board wherein said soft metal coating is composed of one or more metal coatings selected from the group consisting of a gold coating including gold as a main component, a platinum coating including platinum as a main component, a silver coating including silver as a main component, and a palladium coating including palladium as a main component.

Furthermore, the present invention also provides a multilayer flexible wiring board in which at least two layers of metal wirings are laminated while interposing at least an insulating layer therebetween, metal projections provided on one of said metal wirings are connected with the other metal wiring by the application of ultrasonic wave, wherein soft metal coating having a Vickers' hardness of 80 kgf/mm² or lower is formed on one of surfaces of said metal projections and the metal wiring connected with said metal projections, and hard metal coating having a Vickers' hardness of 120 kgf/mm² or higher and soft metal coating having a Vickers' hardness of 80 kgf/mm² or lower are layered on the other of the surfaces of said metal projections and the metal wiring connected with said metal projections, and wherein the soft metal coating formed on the surface of said metal projections are connected with the soft metal coating formed on said metal wiring by the application of ultrasonic wave.

The present invention provides the flexible wiring board in the foregoing, wherein said hard metal coating is composed of nickel coating including nickel as a main component.

The present invention provides the flexible wiring board in the foregoing, wherein one of or both of said soft metal coatings on surfaces of said metal projection and said metal wiring is composed of one or more metal coatings selected from the group consisting of a gold coating including gold as a main component, a platinum coating including platinum as a main component, a silver coating including silver as a main component, and a palladium coating including palladium as a main component.

The present invention also provides an electric device comprising the flexible wiring board and an electric part connected with said flexible wiring board by soldering.

Since the present invention is composed as described above, the metal coating formed on the surface of metal projections contact with the metal coating formed on the metal wiring and they are connected with each other by the application of ultrasonic wave. Accordingly, the metal wirings of the flexible wiring board piece are not connected by soldering, but they are connected by metal bonding between the metal coating. Even if the solder of the electric part is heated to be melted when the electric part is connected with the multilayer flexible wiring board by soldering, the disconnection between the metal wirings and the deterioration of the connection therebetween can be avoided.

At least one of the metal coating contacting with each other is composed of a soft metal coating having a Vickers' hardness of 80 kgf/mm² or lower (where 1 kgf/mm² equals to 9.80665 N/mm²) Accordingly, soft metal coating is bonded to the other metal coating by the application of ultrasonic wave reliably, thereby enhancing the reliability of the multilayer flexible wiring board of present invention.

The metal coating connected with the soft metal coating may be a soft metal coating or may be a hard metal coating a surface of which has a Vickers' hardness of 120 kgf/mm² or higher. Moreover, the hard metal coating and the soft metal coating are laminated with each other.

In particular, if a soft metal coating composed of a gold coating is contacted with a soft metal coating composed of a gold coating to connect them by the application of ultrasonic wave, a multilayer flexible wiring board having a high thermal fatigue resistance can be obtained because of its connectability between the gold coatings.

In the case where a hard metal coating including a nickel coating is formed as an under layer for the gold coating, ultrasonic vibration is strongly concentrated at a contacting portion between the gold coatings, thereby enhancing the connection.

Furthermore, in the case where flexible wiring board pieces are adhered to each other by use of an adhesive layer such as a thermoplastic resin film before the application of ultrasonic wave, positional shift on connecting position of metal projection and metal wiring can be prevented during the application of ultrasonic wave.

The flexible wiring board piece and the multilayer flexible wiring board of the present invention have property of flexibility.

BRIEF DESCRIPTION OF THE DRAWINGS

The above and other objects, features and advantages of the present invention will be apparent from the following detailed description of the preferred embodiments of the invention in conjunction with the accompanying drawings, in which:

FIGS. 3(a) to 3(d) are views for explaining the fabricating steps of a multilayer flexible wiring board of a first embodiment according to the present invention;

PREFERRED EMBODIMENTS OF THE INVENTION

A multilayer flexible wiring board according to a first embodiment of the present invention will now be described in detail below as well as the fabricating method thereof.

Figure 1A:
FIGS. 1(*a*) to 1(*e*) show an embodiment of the fabricating steps of a flexible wiring board piece constituting a multilayer flexible wiring board according to the present invention.
Figure 1B:
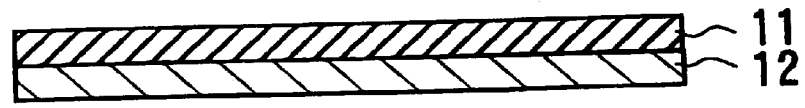
Figure 1C:
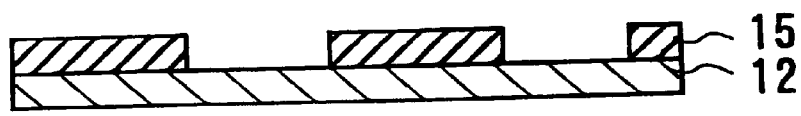

Referring to FIG. 1(a), reference numeral 11 denotes a metal foil composed of copper. Onto the rear of the metal foil 11, a liquid raw material for polyimide film is applied and heat-treated to form a base film 12 (refer to FIG. 1(b)). Next, the metal foil 11 is patterned by the photolithographic and etching processes (refer to FIG. 1(c)). In FIG. 1(c), reference numeral 15 denotes a metal wiring formed by patterning.

Figure 1D:
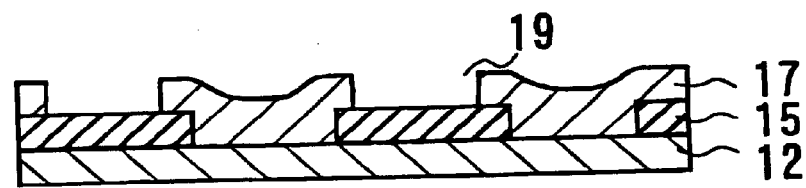

On the metal wiring 15, a polyimide varnish composed of a polyimide precursor is applied. After patterning by the photolithographic and etching processes and being heated, the polyimide precursor is hardened to form a cover film 17 (refer to FIG. 1(d)). In FIG. 1(d), reference numeral 19 denotes a plurality of openings 19 formed in the cover film 17 by patterning (the number thereof is two in the drawing). Each of the openings 19 is arranged above the metal wiring 15. Accordingly, the surface of the metal wiring 15 is exposed at the bottom of each opening 19.

Next, the hard metal coating 20 is formed by metal plating method on the surface of the metal wiring 15 exposed at the bottom of each opening 19. Here, the hard metal coating 20 has a thickness of 5 μm and includes nickel coating having a Vickers' hardness of 120 kgf/mm$^2$ or higher. After then, the soft metal coating 21 having a thickness of 0.02 μm and a Vickers' hardness of 80 kgf/mm$^2$ or lower is formed by on the hard metal coating 20 metal plating method.

Figure 1E:
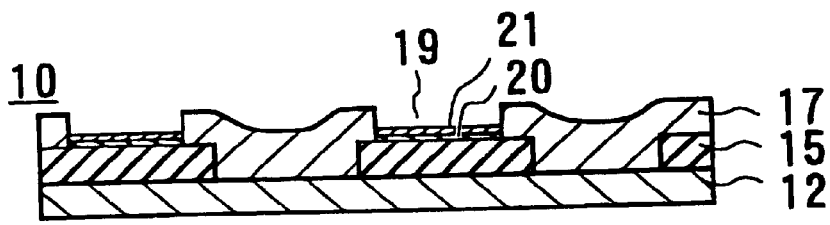

In FIG. 1(e), reference numeral 10 denotes a flexible wiring board piece where the hard metal coating 20 and the soft metal coating 21 are formed thereon. The base film 12 and the cover film 17 are made of non-thermoplastic polyimide film.

Next, the fabricating steps of another flexible wiring board piece which is used with the flexible wiring board piece 10 will be described with reference to FIGS. 2(a) to 2(f).

Figure 2A:
FIGS. 2(*a*) to 2(*f*) show another embodiment of the fabricating steps of a flexible wiring board piece of the present invention.
Figure 2B:
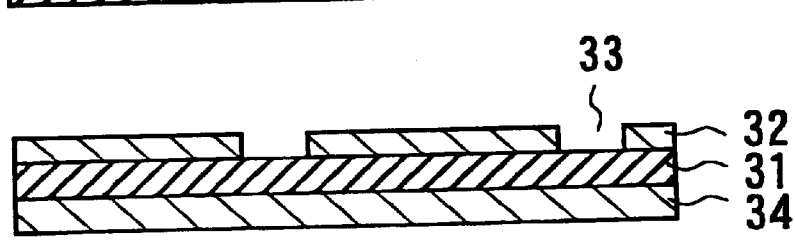
Figure 2C:
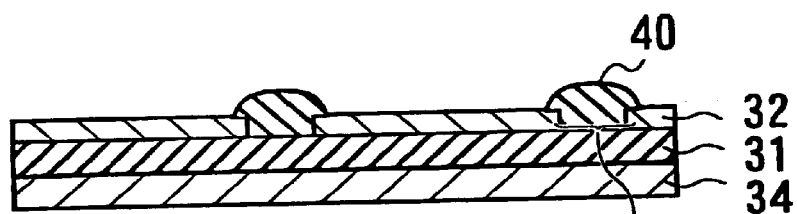

Referring to FIG. 2(a), reference numeral 31 denotes a metal foil composed of copper. A protective film 34 is adhered onto the rear of the metal foil 31 and a liquid raw material of polyimide film is applied onto the opposite surface of the metal foil 31. Then, a cover film 32 is formed by patterning (refer to FIG. 2(b)).

In the cover film 32, a plurality of openings 33 are formed by patterning (the number thereof is two in the drawing). At the bottom of each opening 33, the metal foil 31 is exposed.

Next, copper is deposited by metal plating method on the metal foil 31 exposed at the bottom of each opening 33 to fill the inside of the opening 33 therewith. The copper is further deposited over the surface level of the cover film 32 so as to form a projection body 40 a tip of which protrudes over the cover film 32 (refer to FIG. 2(c)).

Figure 2D:
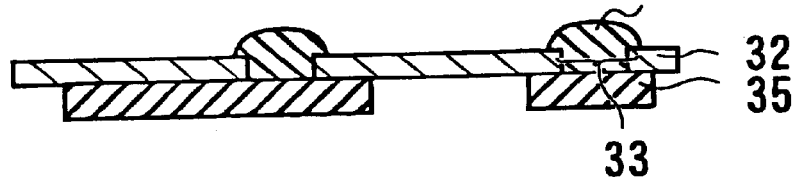

Next, the protective film 34 adhered on the rear of the metal foil 31 is peeled off and the metal foil 31 is patterned by photoresist and etching processes to form a metal wiring 35 (refer to FIG. 2(d)).

Figure 2E:
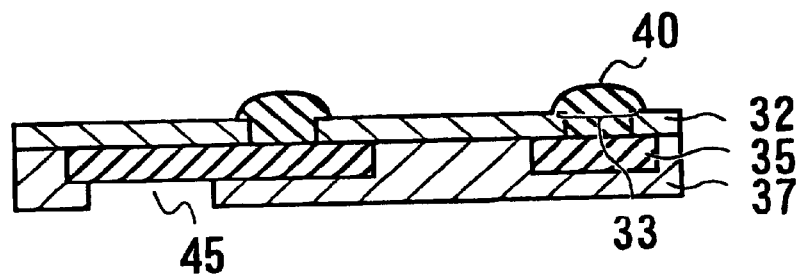

A polyimide vanish comprising a polyimide precursor is applied on the rear surface of the metal wiring 35, and patterned. The patterned polyimide precursor is cured by heat treatment to form a base film 37 as shown in FIG. 2(e). This base film 37 is a non-thermoplastic polyimide film and a plurality of openings 45 are formed therein by patterning (the number thereof is one in the drawing). The metal wiring 35 is exposed at the bottom of each opening 45.

Figure 2F:
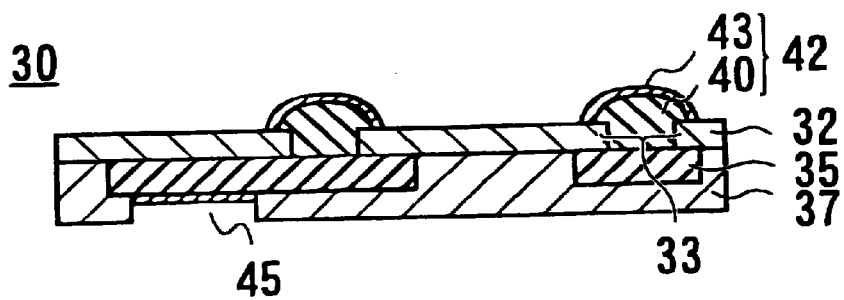

Next, soft metal coating 43 comprised gold coating as a purity of which is 99.99 wt % is formed on the tip surface of the projection body 40, thereby obtaining a metal projection 42 composed of the projection body 40 and the soft metal coating 43. The Vickers' hardness of the soft metal coating 43 is 80 kgf/mm$^2$ or lower. In FIG. 2(f), reference numeral 30 denotes the flexible wiring board piece fabricated by the abovementioned steps.

Next, description will be made concerning the process for obtaining the multilayer flexible wiring board according to the present invention by laminating the above two kinds of flexible wiring board pieces 10, 30 to each other.

Referring to FIG. 3(a), the metal projection 42 of the flexible wiring board piece 30 is positioned relative to the opening 19 formed in the cover film 17 of the flexible wiring board piece 10. A thermoplastic resin film 51 is interposed between the flexible wiring board pieces 10, 30 to be close in contact with each other (refer to FIG. 3(a)).

Next, the flexible wiring board pieces 10, 30 are pressed while they are heated (here the heating temperature is 260° C.) to soften the thermoplastic resin film 51. Thereby adhesive property of the thermoplastic resin film 51 appears to adhere the flexible wiring board pieces 10, 30 to each other (refer to FIG. 3(b)).

By pressing the flexible wiring board pieces 10, 30, the metal projection 42 is forced into the softened thermoplastic resin film 51 and the soft metal coating 43 provided at the tip surface of the metal projection 42 is contacted with the surface of the soft metal coating 21 on the hard metal coating 20 of flexible wiring board piece 10.

Next, the flexible wiring board pieces 10, 30 in this state is arranged over a heater 53 to heat the entire pieces to 100° C. while an ultrasonic wave resonator 54 is contacted with the flexible wiring board pieces 10, 30. Thereafter, the flexible wiring board pieces 10, 30 are pressed while ultrasonic wave is applied thereto (refer to FIG. 3(c)).

Vibration force of the ultrasonic wave is applied in a direction parallel with the surfaces of the flexible wiring board pieces 10, 30. As a result of rubbing the interface between soft metal coating 43 on the tip of the metal projection 42 and the soft metal coating 21 on the hard metal coating 20, the portions are connected with each other to fabricate the flexible wiring board 50 according to the present invention (refer to FIG. 3d).

In FIG. 3(d), reference numeral 55 denotes the connecting portion between the soft metal coatings 43, 21 where the gold coatings composing the soft metal coatings 21, 43 are connected by forming metal bond.

The thus obtained multilayer flexible wiring board 50 was evaluated (example 1).

The multilayer flexible wiring boards were fabricated in the same manner as in Example 1 except for the combination of the metal coating on the metal wiring 15 and the metal coating formed on the surface of the projection body 40, and the heating temperature during the application of ultrasonic wave. The evaluation tests were conducted for Examples 2–7. The hard gold in Example 6 is a gold coating having a Vickers' hardness of 120 kgf/mm$^2$ or higher.

The evaluation results are shown in the following table.

The connection reliability test was conducted in the following manner. That is, using the multilayer flexible wiring boards of Examples 1–7 and continuity test was performed at seventy connecting portions with respect to each multilayer flexible wiring board. After then, the multilayer flexible wiring boards were placed within a high-temperature/high-humidity apparatus for 6 hours. After the continuity test at the same seventy connecting portions, they were again placed within the same apparatus for 94 hours (total time is 100 hours). Then, the continuity test was performed again at the same seventy connecting portions. Incidentally, the conditions in the high-temperature/high-humidity apparatus are temperature: 121° C., air pressure: 202650 Pa and humidity: 100%. Numerals listed in the table 1 are the number of the connecting portions where the continuity is confirmed (if all of the connecting portions are confirmed, the numeral is "70"). In comparison with Comparative Example, Examples 1–7 shows that continuity at almost all of the connecting portions was confirmed and there were no defects or a little defect.

TABLE 1

Evaluation test results

| | Construction of Metal Coating | | Condition | | Connection reliability test | | | Heat resistance test | |
|---|---|---|---|---|---|---|---|---|---|
| | Metal projection side | Opening bottom side | Heating temperature (C. °) | at the connecting portion | Before testing | After 6 hrs. | After 100 hrs. | Before testing | After testing |
| Ex. 1 | soft gold | Ni gold | 100 | Good | 70 | 70 | 70 | 70 | 70 |
| Ex. 2 | soft gold | soft gold | 100 | Good | 70 | 70 | 70 | 70 | 70 |
| Ex. 3 | Ni gold | soft gold | 100 | Good | 70 | 70 | 70 | 70 | 70 |
| Ex. 4 | Ni gold | soft gold | 50 | Good | 70 | 70 | 70 | 70 | 70 |
| Ex. 5 | Ni gold | soft gold | 150 | Good | 70 | 70 | 70 | 70 | 70 |
| Ex. 6 | Hard gold | Ni gold | 100 | Good | 70 | 70 | 68 | 70 | 70 |
| Ex. 7 | Ni gold | soft gold | 25 | Partial connection | 70 | 63 | 55 | 70 | 60 |
| Com. Ex | Ni gold | soft gold | — | Contacting | 70 | 15 | 0 | 70 | 0 | soft gold: a soft gold coating formed by metal plating method and having a thickness of 2 μm(gold coating having its purity of 99.99% or more).
Ni gold: a metal coating having a structure in which a nickel coating having a thickness of 5 μm is formed by metal plating method and furether a soft gold coating having a thickness of 0.02 μm is layered thereon by metal plating method.
Hard gold: a hard gold coating formed by metal plating method and having a thickness of 2 μm In Comparative Example, the hard metal coating including a nickel coating and the soft metal coating including a gold coating are layered on the surface of the metal projection of one of the flexible wiring board pieces, and a soft metal coating including a gold coating is formed on a surface of the metal wiring on the other flexible wiring board piece. Further, they are close contact with each other without applying ultrasonic wave.

Out of the evaluation results in the table 1, condition at connecting portion is a result according to the following manner. That is, a connecting portion of the multilayer flexible wiring board is cut by a microtom and take a photograph of the cross section by use of a scanning electron microscope. Thereafter, the photograph is observed to visual inspection of the condition. Here, the term "good" means the condition in which metal bond is formed in the interface between the metal projection and the metal wiring, and the term "partial connection" means the condition in which metal bond is not entirely, but partially formed. The term "contact" means the condition in which any metal bond is not formed, but the metal projection and the metal wiring are merely contacted with each other at the connecting portion.

Particularly, in Examples 1–5 connection deterioration had not occurred. Accordingly, it has been confirmed that if a soft metal coating is connected with a metal coating composed of a hard metal coating (a nickel coating) and a soft metal coating (a gold coating) and the heating temperature is set at 50° C. or higher during the application of ultrasonic wave, a multilayer flexible wiring board which has a higher reliability can be obtained.

The heat resistance test was conducted in the following manner. That is, after conducting the continuity test with respect to the seventy connecting portions, the respective multilayer flexible wiring boards were placed in a high-temperature/high-humidity apparatus for 192 hours. The conditions in the high-temperature/high-humidity apparatus were temperature: 30° C. and humidity: 65%. After then, the multilayer flexible wiring boards were passed through an infrared reflow furnace the temperature of which was 220° C. for 120 seconds, followed by the continuity test.

The results for the multilayer flexible wiring boards in which the soft metal coatings are connected with each other (Examples 1–6) are especially excellent.

Figure 4A:
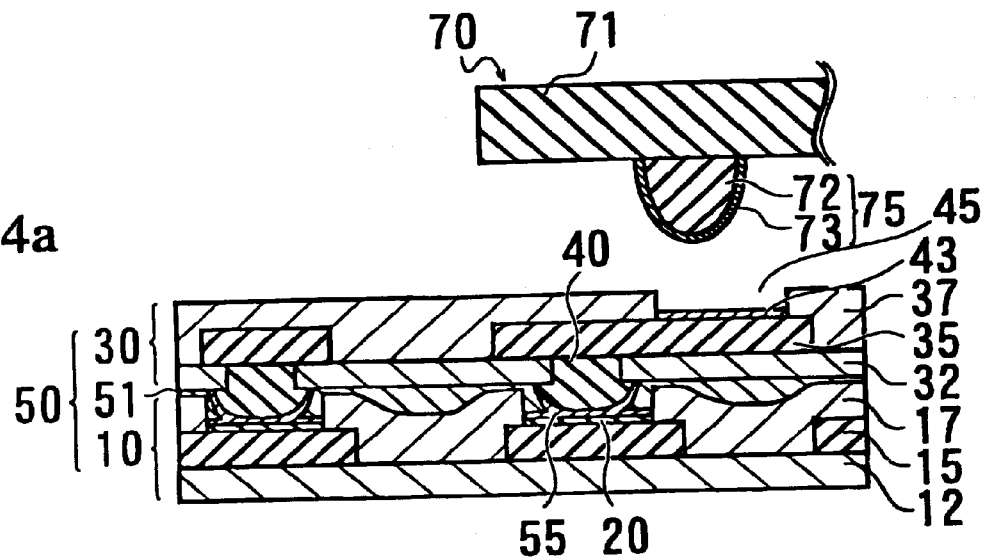
FIGS. 4(a) and 4(b) are views for explaining the mounting step of a semiconductor element on the multilayer flexible wiring board of the first embodiment according to the present invention.

Next, a process for connecting an electric part such as a semiconductor chip with the multilayer flexible wiring board 50 according to the present invention will be described. As shown in FIG. 4(a), a bump 75 formed on an element body 71 of an electric part 70 is arranged above the opening 45 of the multilayer flexible wiring board 50 to contact the tip thereof with the metal wiring 35 at the bottom of the opening 45.

The bump 75 is composed of a bump body 72 comprising copper and a solder coating 73 formed on the surface on the bump body 72. When the tip of the bump 75 is contacted with the surface of the metal wiring 35, the solder coating 73 on the surface of the bump body 72 contacts with the soft metal coating 43 on the surface of the metal wiring 35.

Figure 4B:
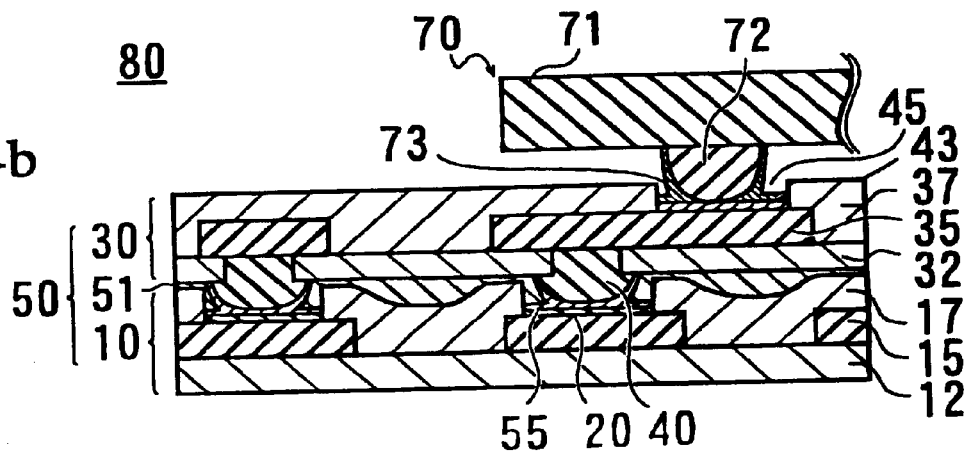

In this state, the electric part 70 is heated to melt the solder coating 73 formed on the surface of the bump body 72. Then the solder coating 73 is hardened, the bump body 72 and the metal wiring 35 are connected with each other via solder coating 73 and soft metal coating 43. In the result, the electric part 70 and the multilayer flexible wiring board 50 are connected with each other electrically and mechanically. In FIG. 4(b), reference numeral 80 denotes an electric device 80 in which the electric part 70 is mounted on the flexible wiring board 50.

The flexible wiring board 50 according to the present invention is structured in such a manner that the connection between the metal wirings 15, 35 is not connected with solder. Accordingly, even if the flexible wiring board 50 is subjected to heat enough for re-melting the solder coating 73 during the mounting of the electric part 70, the connection between the metal wirings 15, 35 does not deteriorate and disconnection therebetween will not occur.

The above description has been directed to the flexible wiring board 50 having the metal projection 42 composed of the projection body 40 and the metal coating 43 formed thereon. However, the flexible wiring board according to the present invention is not limited to the projection body 40 formed of copper plating. For example, the flexible wiring board according to the present invention includes one allowing a metal wiring to be a projection body.

Figure 5:
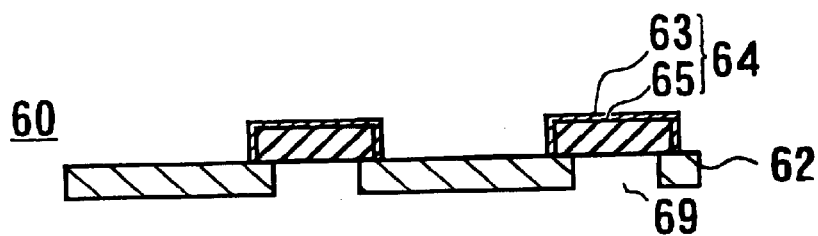
FIG. 5 shows a flexible wiring board piece constituting a multilayer flexible wiring board of a second embodiment according to the present invention.

One example thereof will be described. In FIG. 5, reference numeral 60 denotes a flexible wiring board piece in which a patterned metal wiring 65 is arranged on a base film 62 and a soft metal coating 63 is formed on the surface of the metal wiring 65. In this flexible wiring board piece 60, the surface of the metal wiring 65 is positioned above the surface level of the base film 62. That is, the metal wiring 65 itself functions as a projection body, and accordingly a metal projection 64 is composed of the metal wiring 65 and the soft metal coating 63.

Figure 6A:
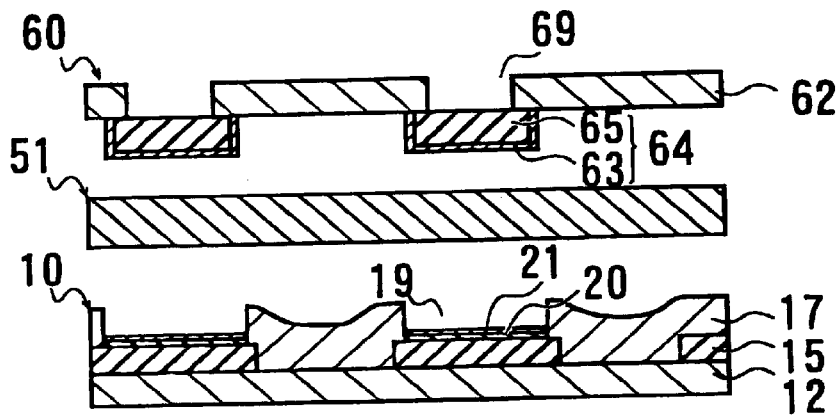
FIGS. 6(a) to 6(d) are views for explaining the fabricating steps of a multilayer flexible wiring board of the second embodiment according to the present invention.

To adhere the flexible wiring board piece 60 to a flexible wiring board piece 10 having a cover film 17 provided with opening 19 and a metal wiring 15 is arranged at the bottom of the opening 19, as shown in FIG. 6(a), the metal projection 64 on the flexible wiring board piece 60 shown in FIG. 5 is positioned to face the opening 19 in the flexible wiring board piece 10 as explained in the above-mentioned example. After then, a thermoplastic resin film 51 is interposed in between the flexible wiring board pieces 10, 60 to come in contact with each other.

Figure 6B:
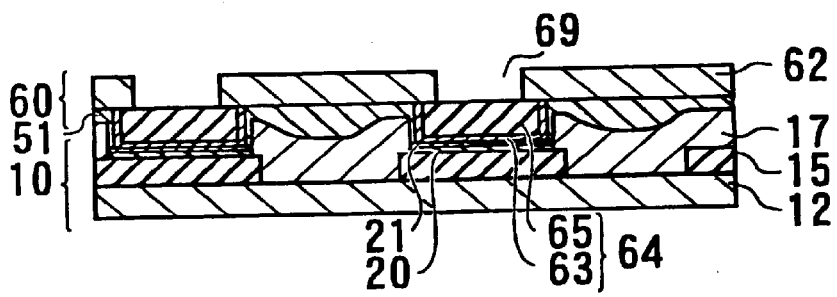

Next, the entire board is pressed while heated so as to soften the thermoplastic resin film 51. The metal projection 64 formed on the surface of the base film 62 is forced into the softened thermoplastic resin film 51 to contact the soft metal coatings 63, 21 on the metal wirings 65, 15 with each other (refer to FIG. 6(b)).

In the base film 62 of the flexible wiring board piece 60 shown in FIG. 5, there are formed openings 69 at the rear surface corresponding to the positions where the metal projections 64 are formed.

Then, the flexible wiring board pieces 10, 60 adhered by use of the thermoplastic resin film 51 is placed above a heater 53 while the openings 69 formed at the rear corresponding to the metal projection 64 faces upward.

Figure 6C:
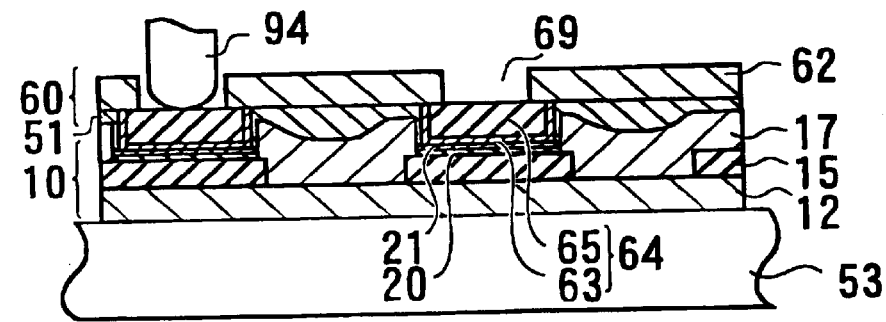

At the bottom of the opening 69 corresponding to the metal projection 64, the surface of the metal wiring 65 (or the metal coating 63 formed on the metal wiring 65) is exposed, where the tip of a rod-shaped ultrasonic wave resonator 94 is contacted thereto to apply ultrasonic wave while heating. As a result, the interface between the metal coatings 21, 63 is applied with ultrasonic wave to rub with each other (refer to FIG. 6(c)).

Figure 6D:
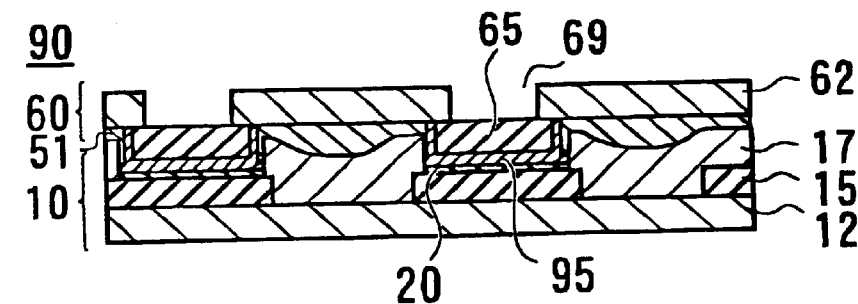

As a result, a metal bond is formed at the interface between the soft metal coatings 21, 63 to electrically connect the metal wirings 15, 65 of the flexible wiring board pieces 10, 60 with each other. After connecting all of the metal projections 64 to be connected with the respective metal wirings 15 by applying the respective metal projections 64 with ultrasonic wave, a multilayer flexible wiring board 90 according to a second embodiment of the present invention is obtained (FIG. 6(d)).

As described above, the multilayer flexible wiring board 50, 90 according to the present invention is constructed in such a manner that the flexible wiring board pieces are not connected by the use of a soldering metal. Since the connecting portion is not melted again, any connection deterioration does not occur even when the board is heated to a temperature enough for melting a soldering metal during the mounting of an electric part such as a semiconductor element.

Although, a gold coating is used as a soft metal coating in the above-mentioned multilayer flexible wiring board 50, 90. The present invention is not limited to such a embodiment. Instead of gold, platinum, silver or palladium may be used for implementing a soft metal coating having a Vickers' hardness of 80 or lower.

Moreover, in the above-mentioned embodiments, a polyimide resin film is used as a thermoplastic resin film 51. However, the present invention can employ other resin films as long as an adhesive property appears upon heating.

Further, in the above-mentioned embodiments, description has been made in the case where the flexible wiring board pieces 10, 30 are adhered to each other by a resin film such as a thermoplastic resin film 51 interposed therebetween, but the present invention is not limited thereto.

Figure 7:
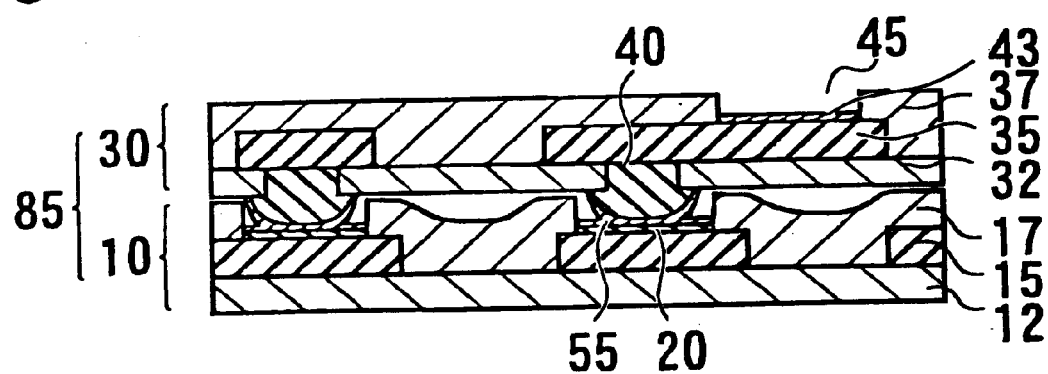
FIG. 7 is a view for explaining a multilayer flexible wiring board of a third embodiment according to the present invention.
Figure 8A:
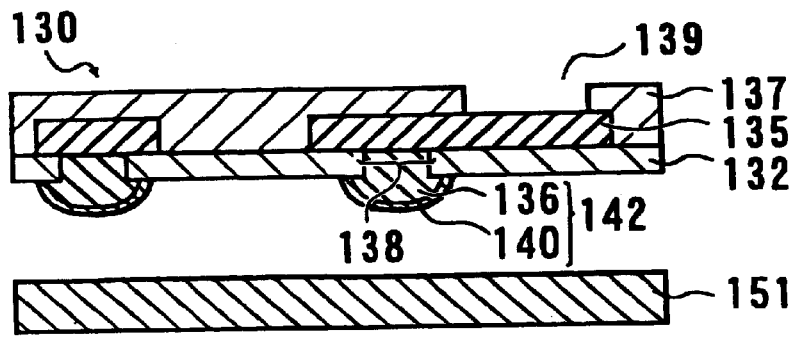
FIGS. 8(a) to 8(c) are views showing a fabricating steps of a multilayer flexible wiring board according to a conventional art.
Figure 8B:
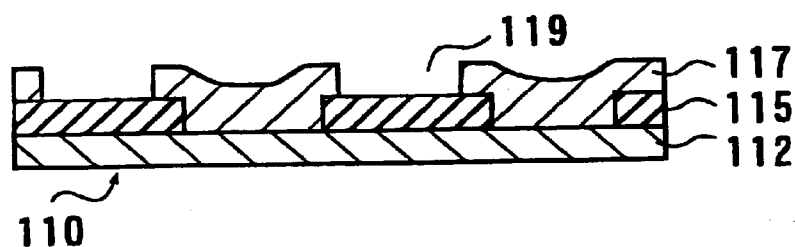
Figure 8B:
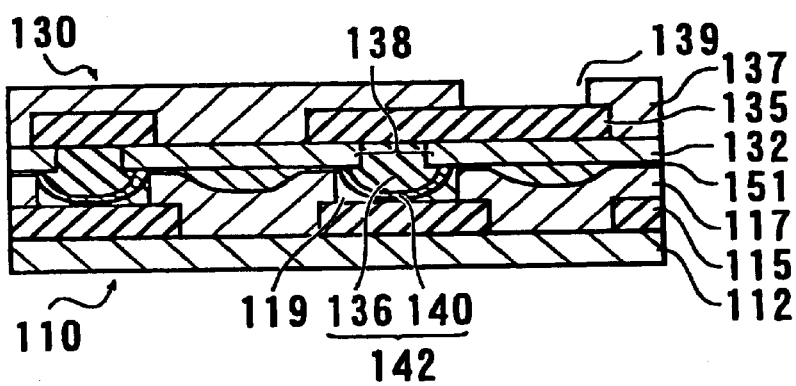
Figure 8C:
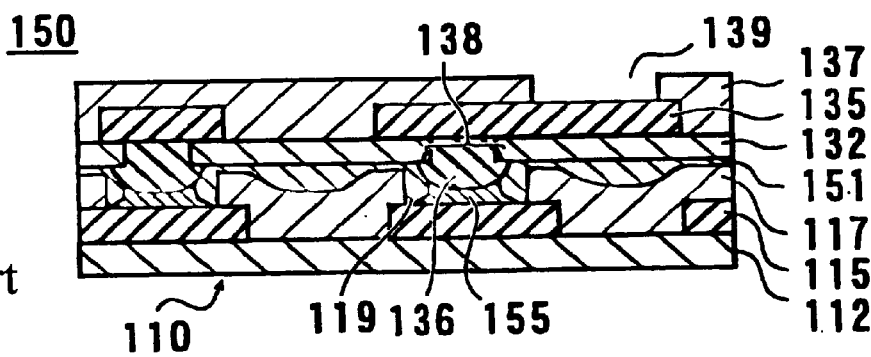
Figures 9A, 9B:
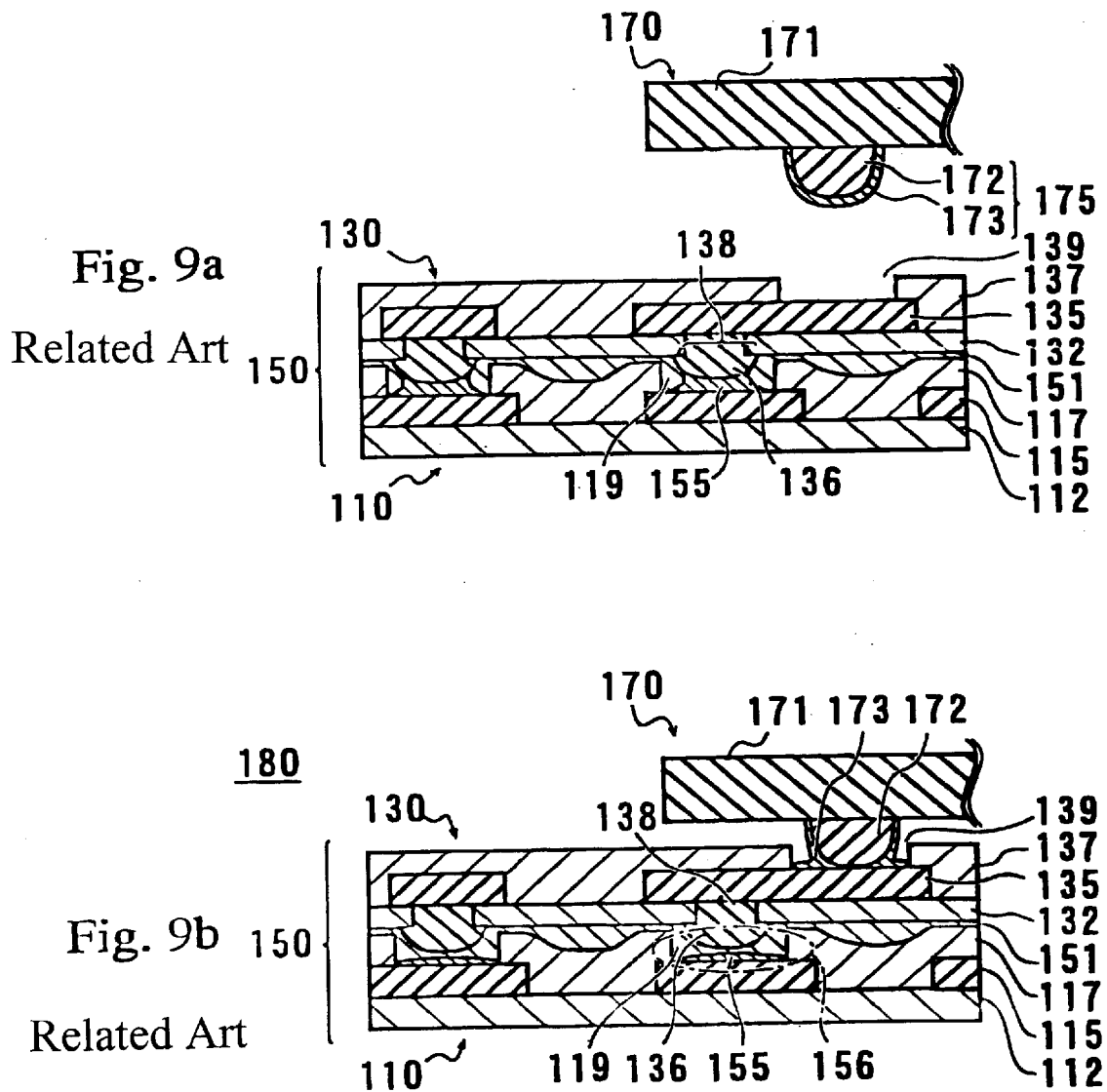
FIGS. 9(a) and 9(b) are views for explaining the connecting steps of an electric part with the conventional flexible wiring board.

In FIG. 7, reference numeral 85 denotes a multilayer flexible wiring board which includes the same flexible wiring board pieces 10, 30 used for the flexible wiring board 50 as shown in the above-mentioned embodiment 1.

However, between the flexible wiring board pieces 10, 30 any thermoplastic resin film is not interposed, but the flexible wiring board pieces 10, 30 are bonded with each other via the portions 55 where the soft metal coatings are connected by the application of ultrasonic wave.

Moreover, in the above-mentioned embodiments, polyimide is used as the base films 12, 37 or the cover films 17, 32. However, the present invention is not limited such a material. For example, it may be substituted with polyethylene, polyester or epoxy resin liquid raw material to be applied to form a film. In addition, the metal wiring is not limited to copper, but may be other metals such as aluminum or the like.

According to the present invention, a multilayer flexible wiring board having a superior heat resistance and conduction reliability can be obtained by connecting soft metal coating each other or metal wirings via a soft metal coating and a hard metal coating.

While there has been described what are at present considered to be preferred embodiments of the invention, it will be understood that various modifications may be made thereto, and it is intended that the appended claims cover all such modification as fall within the true spirit and scope of the invention.

What is claimed is:

1. A fabricating method of a multilayer flexible wiring board, said method comprising the steps of:

laminating a flexible wiring board piece having a metal wiring, in which metal coating is exposed on at least a part of surface of said metal wiring, to another flexible wiring board piece having metal projections on the surface of which metal coating is formed, wherein one of or both of the surface of said metal coating formed on said metal wiring and on the surface of said metal projections is composed of soft metal coating having a Vickers' harness of 80 kgf/mm$^2$ or lower;

interposing a thermoplastic film between said flexible wiring board pieces;

adhering said flexible wiring board pieces to each other by said thermoplastic film;

applying, after adhering said flexible wiring board pieces to each other by said thermoplastic film, an ultrasonic wave to the laminated flexible wiring board pieces while the metal coating formed on said metal wiring is in contact with the metal coating formed on the surface of said metal projections to connect said metal wiring with said metal projections; and pressing at least one of said flexible wiring board pieces to contact the metal coatings with each other while applying ultrasonic wave.

2. The fabricating method of a multilayer flexible wiring board according to claim 1, wherein at least one of said flexible wiring board pieces is heated to 50° C. or higher when applying ultrasonic wave thereto.

3. A fabricating method of a multilayer flexible wiring board, said method comprising the steps of:

laminating a flexible wiring board piece having a metal wiring, in which metal coating is exposed on at least a part of surface of said metal wiring, to another flexible wiring board piece having metal projections on the surface which a metal coating is formed, wherein one of the metal coating formed on said metal wiring and the metal coating formed on the surface of said metal projections is composed of soft metal coating having a Vickers' hardness of 80 kgf/mm$^2$ or lower, the other one of the metal coating formed on said metal wiring and the metal coating formed on the surface of the metal projections is composed of hard metal coating having a Vickers' hardness of 120 kgf/mm$^2$ or higher and soft metal coating having a Vickers' hardness of 80 kgf/mm$^2$ or lower laminated on the hard metal coating;

interposing a thermoplastic film between said flexible wiring board pieces;

adhering said flexible wiring board pieces to each other by said thermoplastic film;

applying, after adhering said flexible wiring board pieces to each other by said thermoplastic resin, an ultrasonic wave to the laminated flexible wiring board pieces while the soft metal coating formed on said metal wiring is in contact with the soft metal coating formed on said metal projections to connect said metal wiring with the metal projections; and pressing at least one of said flexible wiring board prices to contact the metal coating with each other while applying ultrasonic wave.

4. The fabricating method of a multilayer flexible wiring board according to claim 3, wherein at least one of said flexible wiring board pieces is heated to 50° C. or higher when applying ultrasonic wave thereto.

* * * * *